United States Patent [19]

Hara et al.

[11] Patent Number: 5,505,157
[45] Date of Patent: Apr. 9, 1996

[54] LOW HYDROGEN-CONTENT SILICON CRYSTAL WITH FEW MICRO-DEFECTS CAUSED FROM ANNEALING, AND ITS MANUFACTURING METHODS

[75] Inventors: Akito Hara; Masaaki Koizuka, both of Kawasaki, Japan

[73] Assignee: Fujitsu Limited, Kawasaki, Japan

[21] Appl. No.: 249,202

[22] Filed: May 26, 1994

[30] Foreign Application Priority Data

Aug. 25, 1993 [JP] Japan .................. 5-209785

[51] Int. Cl.$^6$ .................. C30B 33/02
[52] U.S. Cl. .................. 117/2; 117/3; 117/20; 117/932
[58] Field of Search .................. 117/2, 3, 20, 36, 117/932

[56] References Cited

U.S. PATENT DOCUMENTS

| | | | |
|---|---|---|---|
| 4,705,591 | 11/1987 | Carle et al. | 117/932 |
| 4,956,153 | 9/1990 | Yamagishi et al. | 117/932 |
| 5,110,404 | 5/1992 | Fusegawa et al. | 117/932 |

OTHER PUBLICATIONS

A. R. Brown et al., Enhanced thermal donor formation in silicon exposed to a hydrogen plasma; Semicond. Sci. Technol. 3 (1988).
M. Stavola et al., Oxygen Aggregation and Diffusivity in Silicon; Electrochem. Soc. 1983.
R. C. Newman et al.; Enhanced Thermal Donor formation and oxygen diffusion in silicon exposed to atomic hydrogen; Electrochem. Soc. 1990.
H. J. Stein et al.; Hydrogen–accelerated thermal donor formation in Czochralski silicon; Appl. Phys. Lett.; Jan. 1, 1990.
R. C. Newman et al., Hydrogen diffusion and the catalysis of enhanced oxygen diffusion in silicon at temperature below 500° C.; J. Appl. Phys., Sep. 15, 1991.

*Primary Examiner*—Robert Kunemund
*Attorney, Agent, or Firm*—Armstrong, Westerman, Hattori, McLeland & Naughton

[57] ABSTRACT

The present invention is to manufacture a low hydrogen-concentration silicon crystal having less micro defects caused from oxygen precipitation generated during an annealing process. Particularly, a silicon crystal including hydrogen concentration lower than $0.55 \times 10^{11}$ cm$^{-3}$, where the hydrogen concentration dependency is small and the micro defect density is less, may be used for a substrate of semiconductor devices. The low hydrogen-concentration silicon substrate is manufactured by measuring the hydrogen concentrations in a silicon crystal and in a hydrogen-doped silicon crystal having a known hydrogen concentration, where both the silicon crystals have been annealed at an equal condition so as to generated thermal donors therein, and by comparing thus measured hydrogen concentrations. The known hydrogen-doped silicon crystal has been prepared by a hydrogen-diffusing annealing in a hydrogen containing atmosphere, where the hydrogen concentration is calculated from the hydrogen partial pressure and the temperature of the annealing.

20 Claims, 7 Drawing Sheets

LOW HYDROGEN-CONTENT SILICON CRYSTAL WITH FEW MICRO-DEFECTS CAUSED FROM ANNEALING, AND ITS MANUFACTURING METHODS

BACKGROUND OF THE INVENTION

1. Field of the Invention

Present invention relates to a low hydrogen-content silicon crystal with few micro-defects including supersaturating oxygen which has been generated in the device manufacturing process, as well as relates to its manufacturing methods.

2. Description of the Related Arts

Silicon crystals used to manufacture an electric or a minute device, for instance, a substrate crystal, are usually manufactured from the Czochralski method which uses a quartz crucible.

The silicon crystal manufactured from the Czochralski method, referred to hereinafter as Cz silicon crystal, includes supersaturated oxygen. Supersaturated oxygen generates defects with oxygen during an annealing process in manufacturing the semiconductor device. As a result, the characteristic of the semiconductor device is deteriorated and its manufacturing yield is decreased. Therefore, a Cz silicon crystal which includes oxygen but does not cause the defect in the annealing process has been requested.

It is known that precipitation of the supersaturated oxygen in the silicon crystal is influenced by carbon, nitrogen and intrinsic point defects density. However, relation between other impurities and the oxygen precipitation has been hardly known.

It was reported recently by the inventor of the present invention on the 1993 Solid State Devices and Materials Conference p.1014, and the Journal of Applied Physics, vol. 74, (1993) p.913–916, that a small amount of hydrogen is included in the Cz silicon crystal, and the hydrogen supersaturated in the silicon crystal easily forms a aggregation resulting in generation of lattice defects. This fact suggests that there is the possibility that the precipitation of the supersaturated oxygen in the silicon crystal is also influenced by the small amount of hydrogen included in the crystal. Therefore, the necessity for clarifying the relation between the hydrogen density in the crystal and the oxygen precipitation has been recognized.

However, because the hydrogen concentration in the Cz silicon crystal is extremely low, its quantitative measurement is difficult. For instance, an infrared absorption method known for its high sensitivity measurement as well as a secondary ion mass spectroscopy (SIMS) have been used for the measurement of the hydrogen concentration in the silicon crystal. However, the hydrogen concentration in the as-grown Cz silicon crystal has not been measured yet due to the limit of the measurement sensitivity because the achievement of the measurement with these methods were for the crystal in which an intentionally large amount of hydrogen was doped.

Thus, because the low concentration of hydrogen in the Cz silicon crystal could not be quantitatively measured by the prior arts, it was impossible to quantitatively examine the relation between the hydrogen concentration in the Cz silicon crystal and the formation of the lattice defect. Therefore, it has still been uncertain whether such an extremely low concentration of hydrogen, such as the hydrogen in the Cz silicon crystal actually used for manufacturing semiconductor devices, influences the generation of the lattice defect during the annealing process.

SUMMARY OF THE INVENTION

The object of the present invention is to provide a silicon crystal having a low density micro defects generated during an annealing process for manufacturing devices, particularly a silicon substrate to be used in a semiconductor device.

Moreover, the present invention provides methods to measure precisely as well as quantitatively the low-concentration hydrogen in a silicon crystal.

Furthermore, the present invention provides a method to more easily sort silicon substrates having few micro defects.

The low hydrogen-concentration silicon crystal related to the present invention includes supersaturated or substantially supersaturated oxygen, referred hereinafter supersaturated oxygen, where the hydrogen concentration is lower than a threshold concentration at which the density of micro defects including the oxygen generated by an oxygen precipitation annealing begins to increase rapidly together with an increase in hydrogen-content in the silicon crystal, for instance, lower than $0.55 \times 10^{11}$ $cm^{-3}$. This low hydrogen-concentration silicon crystal is used for, for instance, a silicon substrate of a semiconductor device.

The low hydrogen-concentration silicon substrate relating to the present invention is manufactured by measuring the hydrogen concentration in a silicon crystal cut out from an ingot including supersaturated oxygen, from an ingot sorted according to the degree of the hydrogen concentration.

Said hydrogen concentration is measured according to the steps of: a thermal donor-generating annealing step where a silicon crystal and a plurality hydrogen-doped silicon crystals each having known hydrogen densities different from each other are annealed under an equal condition so as to generated thermal donors therein; a step to measure thermal donor concentration in the silicon crystal and in the hydrogen-doped silicon crystal; a step to obtain the hydrogen density in the hydrogen-doped silicon crystal having generated thermal donor density therein equal to thermal donor density in silicon crystal as the hydrogen density in the silicon crystal, by interpolating or extrapolating the thermal donor density in the silicon crystal onto the relation between the thermal donor concentrations in the hydrogen-doped silicon crystal and the known hydrogen concentration.

The hydrogen density in the silicon crystal is obtained by the steps of: an outward-diffusing annealing step where a hydrogen-doped silicon crystal having a hydrogen concentration Cs is annealed in an atmosphere including intentionally none of hydrogen for an annealing period t at a temperature $T_D$ so as to diffuse outwards the hydrogen in the vicinity of surface of the hydrogen-doped silicon crystal; a donor-generating annealing where the silicon crystal and the hydrogen-doped silicon crystal are annealed under an equal condition so as to generate thermal donors therein; a step to measure a thermal donor density and a thermal donor distribution along the depth direction in the vicinity of the surface of the hydrogen-doped silicon crystal; a step to obtain a depth x from the surface of the hydrogen-doped silicon crystal, where the thermal donor density equal to the thermal donor density in the silicon crystal is observed; and a step of obtaining the hydrogen density C(x) at the depth x of the silicon crystal at a temperature $T_D$ from a formula:

$$C(x) = Cs(1 - erfc(x(Dt)^{-1/2}/2)$$

where D is diffusion coefficient of hydrogen in silicon, erfc is an error function complement.

Another manufacturing method of a low hydrogen-density silicon substrate according to the present invention comprises the steps of: a donor-generating annealing step to generate thermal donors by annealing silicon crystals cut out from an ingot including supersaturated oxygen at an equal condition; a step to sort a silicon crystal including low-content thermal donors by comparing the donor concentrations in a hydrogen-doped silicon crystal and in the silicon crystal; and a step to manufacture a silicon substrate from an ingot from which the sorted silicon crystal was cut out.

Said hydrogen-doped silicon crystal having a known hydrogen concentration may be manufactured according the hydrogen-diffusing annealing step where the silicon crystal is annealed in an atmosphere including hydrogen so as to thermally equilibrate the hydrogen concentration in the silicon crystal with the hydrogen partial pressure in the atmosphere.

The hydrogen-doped silicon crystals having different hydrogen concentrations may be manufactured according to a hydrogen-diffusing annealing where hydrogen partial pressures in the atmosphere including the hydrogen are different. It may be manufactured according to also a hydrogen-diffusing annealing where the annealing temperatures are different.

The donor-generating annealing carried out in the present invention is preferably lower than 430° C., more preferably 425° C., and the annealing period is preferably less than 1 hour, more preferably 10 to 45 minutes, and particularly preferably 30 minutes.

The above-mentioned features and advantages of the present invention, together with other objects and advantages, which will become apparent, will be more fully described hereinafter, with references being made to the accompanying drawings which form a part hereof, wherein like numerals refer to like parts throughout.

DESCRIPTION OF THE PREFERRED EMBODIMENT

A first preferred embodiment relates to manufacturing of a low hydrogen-content silicon substrate used for semiconductor devices.

First of all, an ingot of a silicon crystal which has been grown up by the Czochralski method is sliced to a wafer, which is then processed to be a silicon substrate having a thickness suitable for the semiconductor device. On the other hand, a thicker wafer, a bulk of 10 mm in thickness, is made from the same ingot. This bulk is diced so as to be a fragment of silicon crystal of 12 mm in width, 20 mm in length and 10 mm in thickness.

The Czochralski method is suitable for growing a large-diameter single crystal includes oxygen which prevents a plastic deformation of the substrate and is effective for gettering. Therefore, many of the substrates of semiconductor devices has been manufactured from the Cz silicon crystal.

Some of the fragments of the silicon crystals are annealed in a hydrogen atmosphere diluted with nitrogen and 22 Torr partial pressure of hydrogen for 40 minutes to 7 hours so as to thermally diffuse the hydrogen. Next, they are cooled quickly by the cooling rate, approximately 1000° C./min., so as to be converted to a hydrogen-doped silicon crystal. This hydrogen-diffusing annealing is carried out at various temperatures within the range of 800° to 1200° C., so as to manufacture the hydrogen-doped silicon crystals each having different hydrogen-contents corresponding to the respective temperatures. The rapid cooling is required in order to prevent the hydrogen from outwardly diffusing during the cooling.

The hydrogen concentrations in the hydrogen-doped silicon crystal are determined according to the following method.

Because the diffusion coefficient of the hydrogen is large in the silicon, the hydrogen concentration in the silicon crystal easily reaches the thermal equilibrium with the atmospheric gas during the hydrogen-diffusing annealing. At this time, the hydrogen-concentration Ca to reach the thermal equilibrium, i.e. the hydrogen-concentration in the hydrogen-doped silicon crystal, is determined as known well depending on hydrogen partial pressure Pa of the atmosphere and the hydrogen diffusing annealing temperature Ta. This concentration Ca is calculated from the formula:

$$Ca = C° exp(-\epsilon/kTa) \times (P_a/P_T)^{1/2} \tag{1}$$

where $C°=4.96\times10^{21}$ cm$^{-3}$, $\epsilon=1.86$ eV, and k and $P_T$ are the Boltzmann's constant and the total pressures of the atmosphere (760 Torr), respectively. In the present preferred embodiment, the hydrogen-concentration in the hydrogen-doped silicon crystals are calculated from formula (1) by using the hydrogen partial pressures of 22 Torr and the hydrogen-diffusing annealing temperatures.

The hydrogen-doped silicon crystals which have any already-known and arbitrary hydrogen-concentration can be manufactured by changing the hydrogen partial pressure or the annealing temperature in the atmosphere of the hydrogen-diffusing annealing according to formula (1). However, the range of the hydrogen partial pressure is usually limited within a narrow range in order to avoid its explosion. Therefore, in manufacturing the hydrogen-doped silicon crystal of a wide concentration range it is easier to change the temperature than to change the hydrogen partial pressure.

Next, the silicon crystal fragment cut out from the ingot is annealed for donor-killing. This annealing is a heat process to evade the influence of the resistance change by the donors, by deleting the donors generated in the as-grown crystal during the crystal growing process, where the heat process is carried out at 750° C. for 5 minutes in nitrogen.

Next, thermal donors are generated by annealing the silicon crystal fragment and the hydrogen-doped silicon crystal under the equal conditions, that is, at a n annealing temperature 425° C. for an annealing period 30 minutes. As well known, thermal donors are the donors generated when the silicon crystal including the supersaturated oxygen is annealed for a relatively long period in the temperature range 400° to 500° C. and are caused from the lattice defects which relate to the aggregation of oxygen.

Next, a silicon wafer is cut out from the middle part of the hydrogen-doped silicon crystal having the thermal donors generated therein, and is polished. An electric resistance is measured on the polished surface of the wafer by a four-point probe method. Its thermal donor density is obtained from thus measured resistance value. The reason why the measurement is carried out on the wafer cut off from the hydrogen-doped crystal is in order to evade the influence of the outward diffusion of hydrogen.

Figure 1:
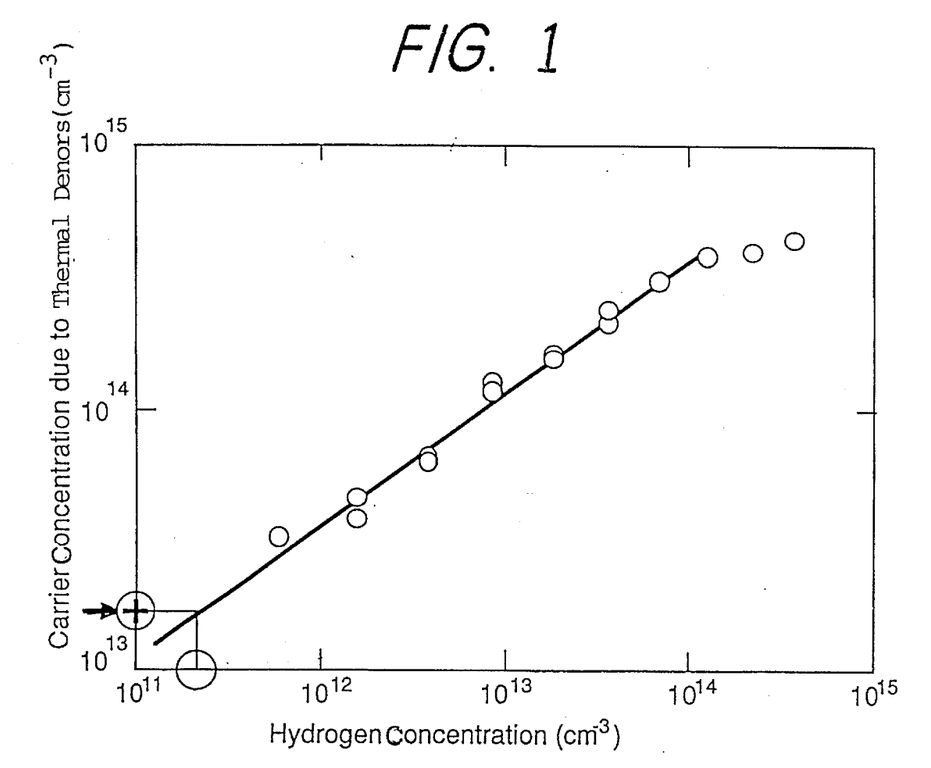
FIG. 1 shows a hydrogen-content dependency of thermal donor concentration.

FIG. 1 shows a hydrogen-content dependency of the thermal donor concentration in the hydrogen-doped silicon crystal. In FIG. 1 the hydrogen concentration is calculated from formula (1), and the thermal donor concentration is obtained from the four-terminal resistance. FIG. 1 clarifies that there is a strong relation between the concentration of the thermal donor and hydrogen content in the Cz silicon crystal. And, it is seen that each of logarithms of the thermal donor concentration and hydrogen content is in a linear relation in the hydrogen concentration range of $10^{12}$ to $10^{14}$ atoms cm$^{-3}$.

In addition, the thermal donor concentration in the fragment of the silicon crystal is measured by the method same as the case of above-mentioned hydrogen-doped silicon crystal, and is found to be $1.3 \times 10^{13}$ cm$^{-3}$. The thermal donor concentration of the silicon crystal shown by the arrow in FIG. 1 is extrapolated along the linear relation of FIG. 1 and it is found that the corresponding hydrogen content is $2.5 \times 10^{11}$ cm$^{-3}$.

Because the two kinds of samples, i.e. the silicon crystal fragment and the hydrogen-doped silicon crystals, are cut out from almost the same position of the ingot, the thermal donor formations are almost equal except the hydrogen-content. Therefore, the relation acquired about the hydrogen-doped silicon crystal in FIG. 1 corresponds to the relation about the silicon crystal fragment. Therefore, the hydrogen density acquired by interpolating or extrapolating the thermal donor concentration in the silicon crystal fragment onto the relation of FIG. 1 can be applied to the hydrogen concentration of the silicon crystal fragment, i.e. the hydrogen concentration of the ingot.

The generation condition of the thermal donors is hereinafter explained. From the view point of the measurement sensitivity, it is desirable that the thermal donor generating annealing for generating the thermal donor is carried out under the condition where the thermal donor density changes sharply in response to the change in the hydrogen-content. It was clarified by the below experiment that such conditions are achieved by a low temperature annealing and by a short period annealing.

At first, 2 mm thick wafers are cut out from the ingot from which the hydrogen-doped silicon crystal had been cut out.

This wafer is annealed in an atmosphere of oxygen or nitrogen at 750° C. for 15 minutes so as to be dehydrogenated, and as a result, becomes a dehydrogenated wafer having a low hydrogen-concentration. The comparison result of the generation rate of the thermal donors of this dehydrogenated wafer and the hydrogen-doped wafer is shown in FIGS. 2 and 3.

Figure 2:
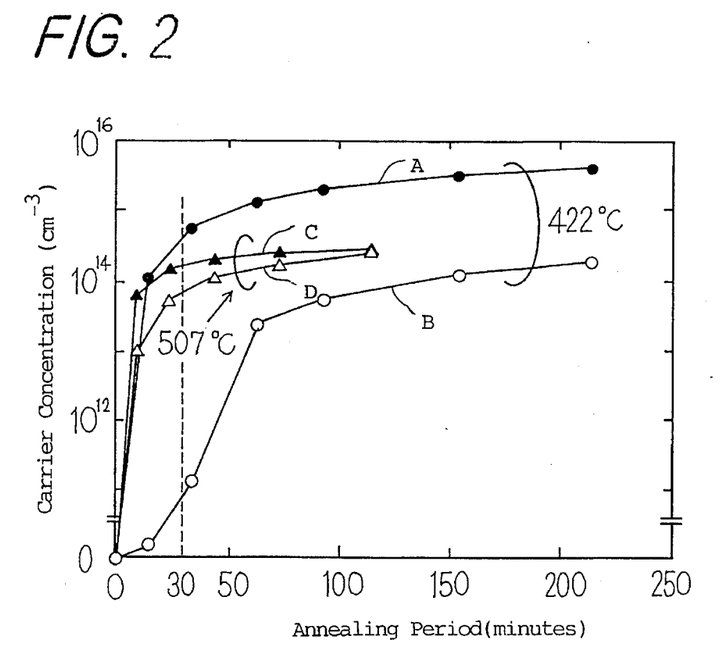
FIG. 2 shows annealing period dependencies of carrier concentration.
Figure 3:
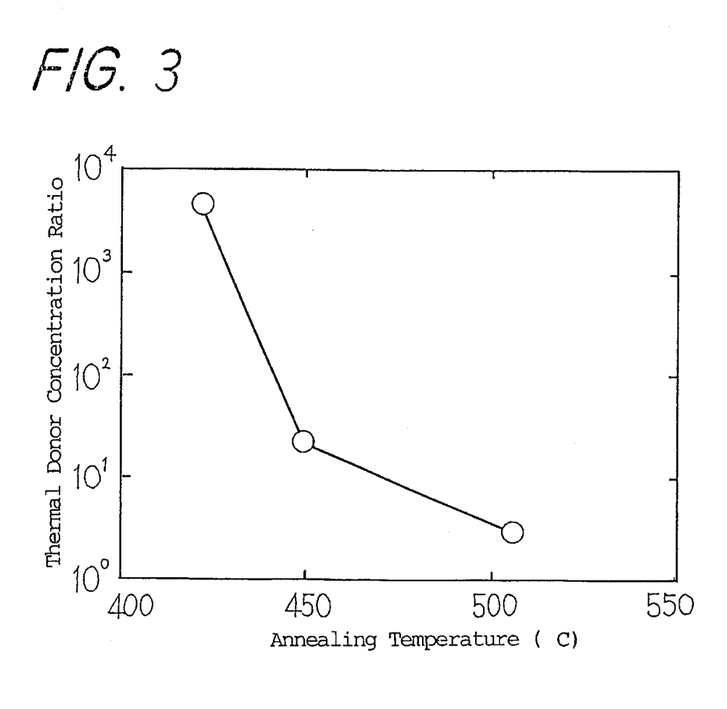
FIG. 3 shows an annealing temperature dependency of thermal donor concentration ratio.

FIG. 2 shows the annealing period dependency of carrier density. There is shown a relation between the thermal donor generation annealing period and the carrier density caused from the thermal donors generated by this annealing.

In FIG. 2, A and B show the case of 422° C. in the annealing temperature to generate the thermal donors, and C and D show the case of 507° C., where A and C are of the hydrogen-doped wafer and D and B are of the dehydrogenation-annealed crystal. In manufacturing a hydrogen-doped wafer, the 2 mm thick wafer is doped with hydrogen in an atmosphere having the hydrogen partial pressure of 22 Torr by being heated at 1200° C. for 30 minutes and then quenching.

In the comparison of A and B in FIG. 2, the carrier generation rate of the hydrogen-doped wafer at the initial stage of the annealing is faster than that of the dehydrogenation-annealed wafer, in case where the thermal donor generation annealing temperature is 422° C.

Therefore, within one hour of the annealing period, the difference in the carrier concentration of the hydrogen-doped wafer and the dehydrogenation-annealed wafer, that is, the difference of the thermal donor concentration, is large.

Over one hour of the annealing period, though the difference in the carrier concentration of the hydrogen-doped wafer and the dehydrogenation-annealed wafer becomes small, there still is a difference in the carrier concentration as large as more than 10 times.

On the other hand, in the comparison of C and D of FIG. 2, with 507° C. annealing temperature within 20 minutes there is a difference in the carrier concentrations of the hydrogen-doped wafer and the dehydrogenation-annealed wafer. However, the difference is hardly recognized at more than one hour.

FIG. 3 shows an annealing temperature dependency of the ratio of the thermal donor concentration generated in the hydrogen-doped wafer to that in the dehydrogenation-annealed wafer in the case where the annealing is carried out for 30 minutes to generate the thermal donors.

FIG. 3 shows that, when the thermal donor annealing temperature is less than 430° C., the ratio of the thermal donor concentration generated in the hydrogen-doped silicon wafer to that in the dehydrogenation-annealed wafer is large.

The results obtained from FIG. 2 and FIG. 3 clarify that the shorter the annealing period is, the larger the difference between the thermal donor concentrations in the hydrogen-doped wafer and the dehydrogenation-annealed wafer is. Therefore, the measurement sensitivity of the hydrogen content related to the present invention can be improved by performing the thermal donor generation-annealing at the low temperature for the short period. Therefore, in order to precisely measure the hydrogen-content, it is preferable to generate the thermal donors by performing the annealing at lower than 430° C. for shorter than one hour (more preferably shorter than 30 minutes).

On the other hand, the lower the donor generation-annealing temperature is, the longer the processing period is required, accordingly, the more deteriorated the productivity is. In order to limit the processing period within 30 minutes, the annealing temperature be preferably 425° C.

The atmosphere of the outward diffusing process of hydrogen may be an inert gas including essentially none of hydrogen, for instance, nitrogen, oxygen, helium or argon, each highly pure.

A second preferred embodiment of the present invention relates to a method of sorting the silicon crystal of low hydrogen-content according to the thermal donor concentration by directly comparing the thermal donor concentration in the sample fragment and in the hydrogen-doped silicon crystal, instead of utilizing the relation between the concentrations of the thermal donors and hydrogen-content shown in FIG. 1.

In similar way to the first preferred embodiment, 10 mm thick fragments of the silicon crystal are cut out from the ingot having a specific resistance 3000 ohms cm or more; and some of them are made the hydrogen-doped silicon crystals. The hydrogen-doped silicon crystals of three kinds of concentrations are prepared by being annealed in an atmosphere of 22 torr hydrogen partial pressure at 650° C. for 40 minutes, at 800° C. for 40 minutes and at 1000° C. for 30 minutes, respectively. On the other hand, the silicon crystal fragment which has not been annealed for the hydrogen diffusion is annealed in a dry oxygen atmosphere at 750° C. for 5 minutes so as to kill the thermal donor formed during crystal-growing.

Next, the silicon crystal fragment and the hydrogen-doped crystal are annealed for thermal donor generation in a dry oxygen atmosphere at 425° C. for 30 minutes.

Figure 4:
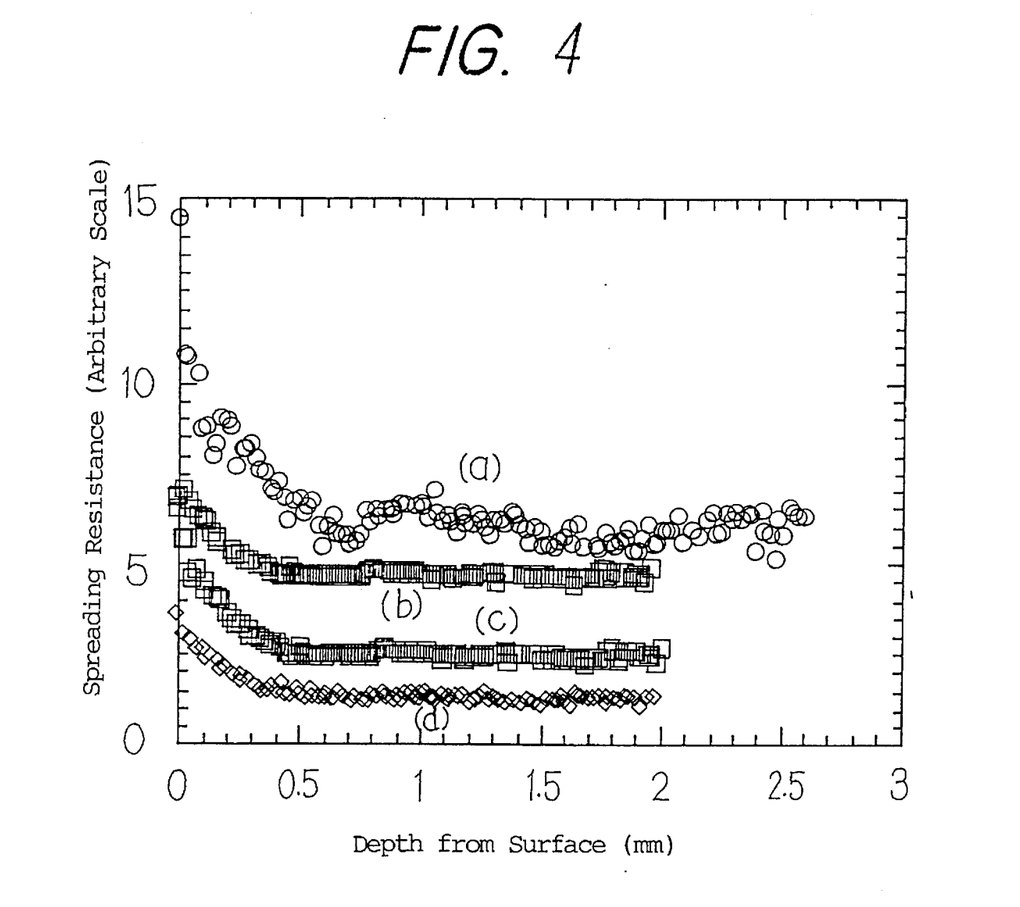
FIG. 4 shows an explanatory figure of the second preferred embodiment of the present invention.

Next, an angle lapping is carried out on the silicon crystal fragment and the hydrogen doped silicon crystal. Then, spreading resistances are measured on each of thus angle-lapped surfaces. The results are shown in FIG. 4. By this angle lapping, the surface layer of the sample is expanded in the direction of the depth and is exposed on a surface having an angle 11° to the sample surface.

FIG. 4 explaining the second preferred embodiment of the present invention shows the distribution along the depth direction of the spreading resistance in the vicinity of the silicon crystal surface.

In FIG. 4, (a) shows the result regarding the fragment of the silicon crystal; and (b), (c) and (d) show the results of the hydrogen-doped silicon crystals prepared by the hydrogen diffusing annealing at 650° C. for 40 minutes, at 800° C. for 40 minutes, and at 1000° C. for 30 minutes, respectively. In FIG. 4 it is observed that the spreading resistances are large at the surface and are constant at a depth 2 mm from the surface. The reason why the spreading resistance is high at the surface is that the hydrogen content at the surface becomes lowers due to the outward diffusion of the hydrogen included innerside; and consequently the thermal donor concentration has become less. The depths where the spreading resistances become constant are about 1 mm from the surface of the silicon crystal fragment and in the hydrogen-doped silicon crystal, as well. According, the hydrogen concentration originally included in these silicon crystals is maintained as it is at a position deeper than 1 mm from the surface. Therefore, the thermal donor concentration at a position deeper than the depth where the spreading resistance becomes constant corresponds to the hydrogen content in the silicon crystal.

In FIG. 4 the one having the spreading resistance closest to the sample silicon crystal for the measurement is the hydrogen-doped silicon crystal indicated with (b). The hydrogen-concentration of this hydrogen-doped silicon crystal is calculated to be $2 \times 10^{10}$ cm$^{-3}$ from formula (1). Therefore, the silicon crystal fragments whose ingot had a hydrogen-concentration lower than $2 \times 10^{10}$ cm$^{-3}$ are discriminated so as to be sorted out.

A third preferred embodiment of the present invention relates to a method of manufacturing the low hydrogen-concentration silicon substrate so as to improve the first preferred embodiment.

In the first preferred embodiment, it is necessary to prepare the plural hydrogen-doped silicon crystals having different hydrogen-contents or the hydrogen-doped silicon crystals having a predetermined concentration to be the standard. Manufacturing of this hydrogen-doped silicon crystal is possible only with a hydrogen-diffusing annealing where the temperature and hydrogen partial pressure are precisely controlled, accordingly, requires considerable labor. The third preferred embodiment is to evade this problem, and, relates to a method of measuring hydrogen concentration in the silicon crystal by using a hydrogen-doped silicon crystal having an arbitrary hydrogen-content.

At first, in the similar way to the first preferred embodiment a silicon crystal of 10 mm in thickness, 12 mm in width an 20 mm in length is cut out of the ingot of the as-grown Cz silicon crystal.

Next, one of the silicon crystal fragments is made to be a hydrogen-doped silicon crystal by being annealed at 1150° C. For 120 minutes in a nitrogen atmosphere including a partial pressure 22 Toor of hydrogen so as to diffuse the hydrogen.

Next, the hydrogen-doped silicon crystal is annealed at 800° C. for 10 minutes in a nitrogen atmosphere as an outward diffusing annealing. This outward diffusing annealing is such that the hydrogen-doped silicon crystal is heated in an atmosphere including no hydrogen, for instance, the vacuum, an inert gas or a nitrogen gas. As a result, the hydrogen in the vicinity of the surface of the hydrogen-doped silicon crystal diffuses outside, so that the hydrogen-concentration distribution is formed along the depth direction in the vicinity of the surface.

Next, the hydrogen-doped silicon crystal and the silicon crystal fragment annealed for the donor-killing at 750° C. for 5 minutes in advance are annealed at 425° C. for 30 minutes for the thermal donor generation. Next, the hydrogen-doped silicon crystal and the silicon crystal fragment are angle-lapped, where the distribution of spreading resistance on the angle-lapped surface is measured by the method same as the second preferred embodiment. The results are shown in FIG. 5.

Figure 5:
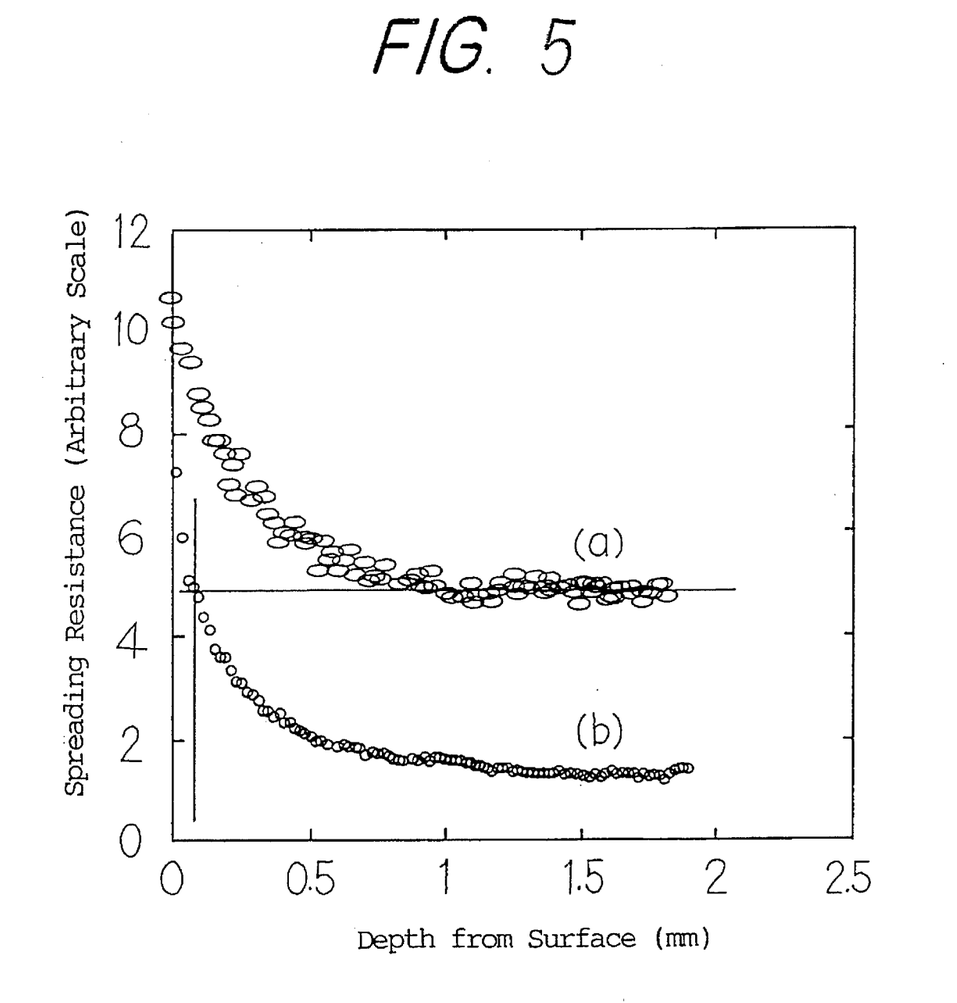
FIG. 5 shows an explanatory figure of the third preferred embodiment of the present invention.

FIG. 5 shows the distribution of the spreading resistance in the vicinity of the surfaces of the silicon crystal and of the hydrogen doped silicon crystal annealed for the outward diffusing.

In FIG. 5, (b) and (a) indicate the spreading resistances of the hydrogen-doped crystal and the silicon crystal fragment, respectively.

According to the distribution of the spreading resistance shown in FIG. 5, the resistance becomes high at the surface, and constant at a position sufficiently deep from the surface. This distribution is caused from the fact that the generation of the thermal donor is a little in the vicinity of the surface as a result of the hydrogen-content in the vicinity of the surface having decreased during the hydrogen outward-diffusion annealing at 800° C. for 10 minutes. In the hydrogen-doped silicon crystal, the spreading resistance reached a constant value at a position deeper than 1.5 mm from the surface. This constant value corresponds to the thermal donor density generated in the silicon crystal having the hydrogen-content included in the hydrogen-doped silicon crystal, that is, the equilibrated hydrogen-concentration at the hydrogen diffusing annealing temperature.

Hydrogen-concentration distribution C(x) at a depth x from the surface of the hydrogen-doped silicon crystal generated by the outward-diffusing annealing is obtained by the following formula, where the hydrogen-concentration at the surface is 0, and the hydrogen-concentration at a position sufficiently deep from the surface, i.e. the hydrogen concentration of the hydrogen-doped silicon crystal before annealed for the outward-diffusing, is Cs:

$$C(x) = Cs(1 - erfc(x(Dt)^{-1/2}/2)) \tag{2}$$

where, t is a period for the outward-diffusing annealing, and D is a diffusion coefficient of hydrogen in silicon at a temperature $T_D$ of the outward-diffusing annealing; and coefficient D is given by $$D = D_o \exp(-\epsilon_D/kTD) \quad (3)$$

where $D_o = 9.67 \times 10^{-3}$ cm²/sec, and $\epsilon_D = 0.48$ eV. This formula is described in "Hydrogen in semiconductors: Semiconductors and Semimetals Vol.34 (Academic Press)".

Hydrogen-concentration Cs at the deep position of the hydrogen-doped silicon crystal is calculated to be $2 \times 10^{14}$ cm$^{-3}$ from formula (1), where the hydrogen partial pressure is 22 Torr and the temperature of hydrogen diffusing annealing is 1150° C. Therefore, the hydrogen-concentration C at a depth x mm after the outward-diffusing annealing at 800° C. for 10 minutes is calculated from formulas (2) and (3) as follows:

$$C(x) = 2 \times 10^{14} \text{ cm}^{-3} \times (1 - \text{erfc}(x/3.6)) \quad (4)$$

On the other hand, the spreading resistance of the silicon crystal fragment indicated with (a) in FIG. 5 reaches a constant value at the depth more than 1 mm. This constant value is determined according to the hydrogen-concentration in as-grown crystal before the outward diffusing. According to FIG. 5, in the hydrogen-doped silicon crystal, the depth, at which the spreading resistance reaches the same spreading resistance value at the sufficiently deep position as this silicon crystal fragment, is 0.1 mm. The hydrogen-concentration at this depth of the hydrogen-doped silicon crystal is determined to be $6 \times 10^{12}$ cm$^{-3}$ by substituting x=0.1 in formula (4). The ingots are sorted according to this value because this hydrogen-concentration shows the hydrogen-concentration in the silicon crystal fragment.

In the hydrogen-diffusing annealing in the third preferred embodiment, it is not necessary to prepare in advance a hydrogen-doped silicon crystal having the predetermined hydrogen-content. Moreover, the outward diffusing annealing is not in order to generate specific hydrogen-concentration distribution. Therefore, these annealing are not limited to the annealing for which the hydrogen partial pressure and the heating temperature are specially controlled, but may also be carried out during growing the crystals or during manufacturing the devices as long as the temperature and the period are known. The measurement of the hydrogen-concentration in the third preferred embodiment is limited by the measurement sensitivity of the thermal donor concentration.

A fourth preferred embodiment of the present invention relates to manufacturing of a silicon substrate having few lattice defects generated by the anneal during the manufacturing process of the device.

A 1 mm thick silicon substrate is manufactured by slicing an as-grown Cz silicon crystal having the hydrogen-concentration of $2.5 \times 10^{11}$ cm$^{-3}$. At the same time, a silicon crystal fragment similar to that of the first preferred embodiment is cut out from a part of the same as-grown Cz silicon crystal. And, this fragment is annealed together with the silicon substrate in a nitrogen atmosphere at a temperature 750° C. for 5 minutes as the outward diffusing process of hydrogen. Next, the micro lattice defects including oxygen are generated by adding two steps of an annealing at 425° C. for 20 hours and a subsequent annealing at 700° C. for 48 hours, respectively. Hydrogen-concentration Cs of this as-grown Cz silicon crystal is obtained by the same method as the first preferred embodiment of the present invention.

Figure 6:
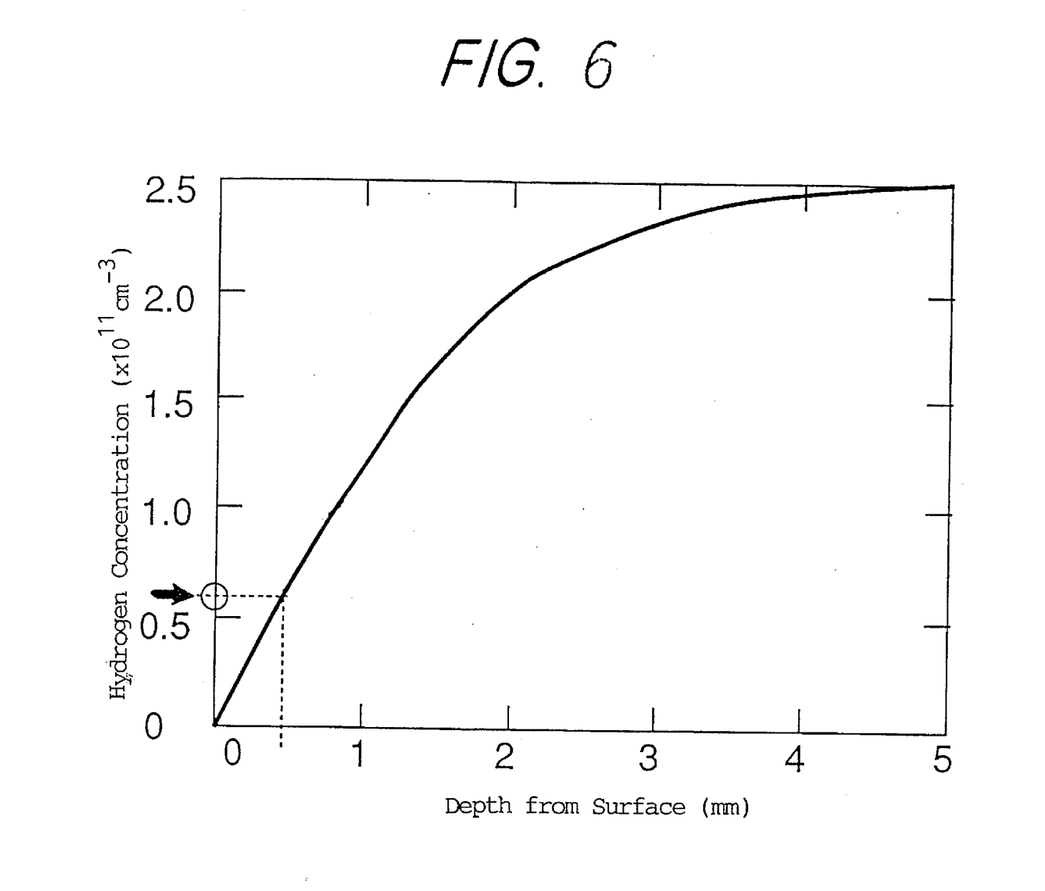
FIG. 6 shows a hydrogen-content distribution after an outward diffusion process.

FIG. 6 shows a hydrogen-concentration distribution after the outward-diffusion annealing, calculated from formula 2. FIG. 6 shows that the silicon crystal whose hydrogen-concentration is lower than the as-grown Cz silicon crystal is made at the surface by the outward-diffusion annealing.

Figure 7:
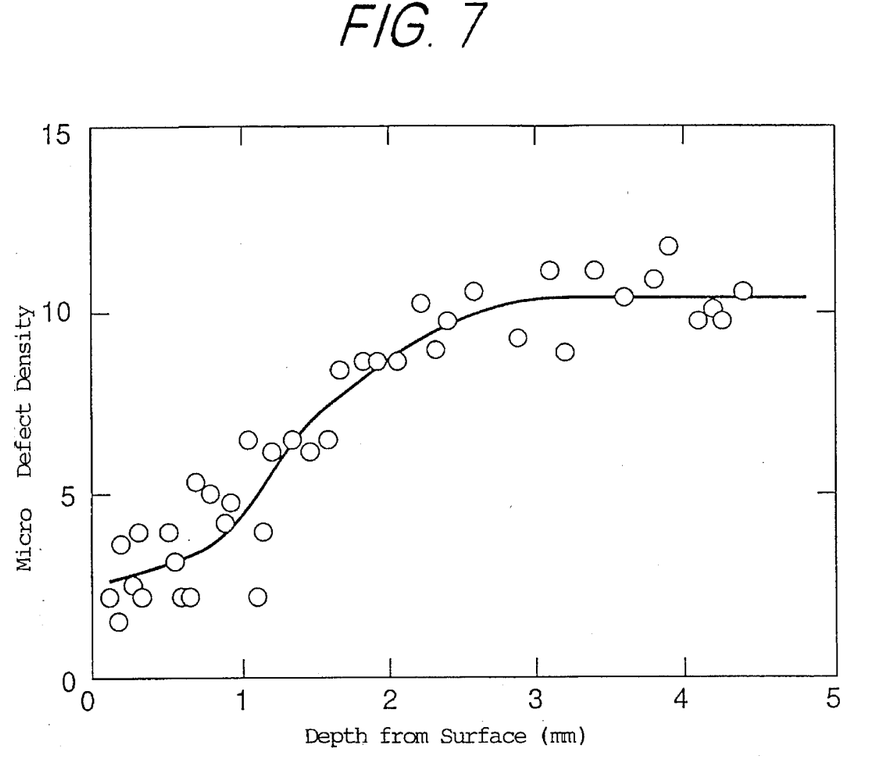
FIG. 7 shows a micro defect density distribution.

FIG. 7 shows the density distribution of the micro defects along the depth direction generated in the silicon crystal fragment by the two-step annealing. The defect density are measured by observing via a microscope the defects on the angle-lapped surface which has been chemically etched further typically with a well-known etchant named Secco etchant.

In FIG. 7, the micro defect density is about $3 \times 10^5$ cm$^{-2}$ at the surface to 0.5 mm depth, and increases gradually with the depth, while the micro defect density increases rapidly at position deeper than 0.5 mm from the surface.

The hydrogen-concentration at the depth 0.5 mm from the surface is obtained from FIG. 6 as about $0.55 \times 10^{11}$ cm$^{-3}$ as indicated with dotted lines. In FIG. 7, it is apparently seen that the micro defect density steeply increases beyond a threshold 0.5 mm depth having a hydrogen-concentration of about $0.55 \times 10^{11}$ cm$^{-3}$. And, with hydrogen-content less than the threshold $0.55 \times 10^{11}$ cm$^{-3}$ the generation of the micro defect density is a little.

According to the fourth preferred embodiment, silicon substrates having the hydrogen-concentration lower than $0.55 \times 10^{11}$ cm$^{-3}$ are sorted by measuring the hydrogen-concentration in the silicon substrates. Thus sorted substrates are used as silicon substrates of semiconductor devices.

Figure 8:
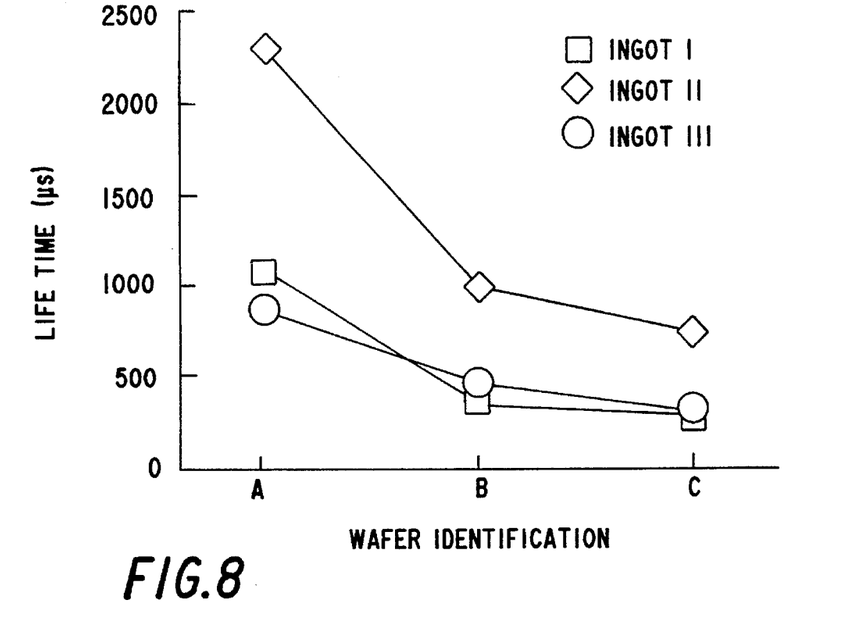
FIG. 8 shows changes in life time due to dehydrogenating annealing.

FIG. 8 shows life time of wafers after the oxygen precipitating annealing, where three wafers A, B and C are made from three different as-grown ingots of silicon crystals, respectively. These wafers have been prepared according to the following procedure. At first, a 10 mm thick silicon bulk and a 1 mm thick wafer A were cut out from each ingot. The silicon bulk and the wafer were annealed in nitrogen at 750° C. for 5 minutes for the dehydrogenation. Next, the silicon bulk and the wafer were annealed in nitrogen at 425° C. for 6 hours to precipitate oxygen. Next, two 1 mm thick wafers were cut out from a surface part and a middle part in thickness of the silicon bulk, respectively, denoted with B and C. The life times are measured after the wafers are annealed at 600° C. for 30 minutes to kill the thermal donors formed during the annealing at 425° C. for 6 hours. FIG. 8 shows the results.

In FIG. 8, C shows the 1 mm thick wafer cut out from the middle part of the 10 mm thick silicon bulk, B shows a wafer cut out from the surface part of the silicon bulk, and A shows a wafer cut out directly from the ingot, where the three lines correspond to each of three ingots. The reason why the life time of wafer B cut out from the surface part of the silicon bulk is longer than wafer C cut out from the middle part is because the hydrogen outward-diffusion has caused the hydrogen-content in the vicinity of the surface to lower so that the oxygen precipitation has been suppressed. Among them the longest life time is of the dehydrogenated wafer A. It is believed that the reason is that in a thin wafer the entire wafer becomes low in the hydrogen-content. Thus, the silicon substrate with little generation of the crystal defects including oxygen can be manufactured by the dehydrogenation annealing of a thin wafer less than 1 mm in thickness.

Figure 9:
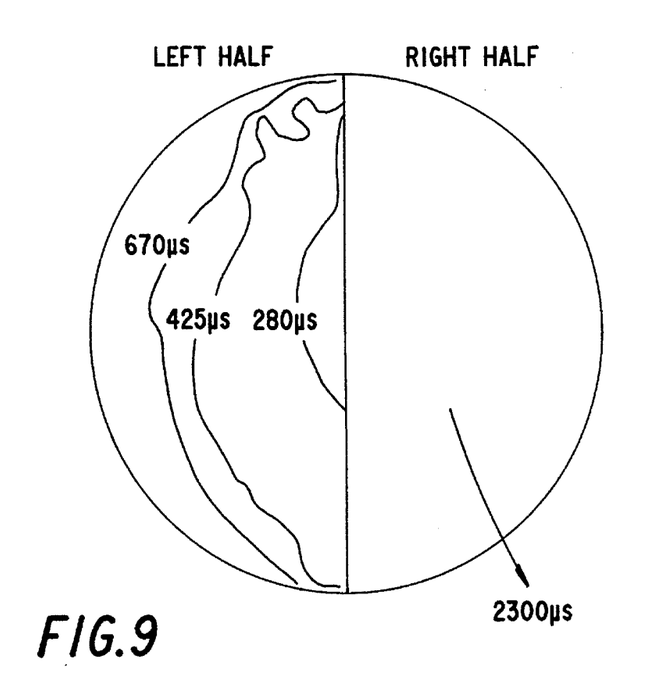
FIG. 9 shows life time distribution in a wafer.

The left half of FIG. 9 shows the distribution of life time of the wafer C cut out from the middle of the 10 mm thick silicon bulk. The wafer has been prepared after annealing the 10 mm thick silicon bulk crystal in nitrogen at 425° C. for six hours so as to precipitate oxygen and then annealed at 600° C. for 30 minutes to kill the thermal donors. The life time is short at the center of the wafer and along at the peripheral area. This fact suggests that the hydrogen outward-diffusion generated during the crystal growing has caused the distribution of hydrogen-concentration. The right half of FIG. 9 shows the wafer A on which the life time is uniform and as long as 2300 μsec. This is because the hydrogen has disappeared during the dehydrogenation annealing at 730° C. for 5 minutes.

For the measurement of the donor concentration, in place of the above-mentioned four-point method or spreading resistance method, there can be employed the undermentioned methods, such as, a Hall effect measurement method, a measurement of junction capacitance, DLTS (Deep Level Transient Spectroscopy), an electron spin resonance method, a light luminescent method, PTIS (Photo Thermal Ionization Spectroscopy) or ODMR (Optically Detected Magnetic Resonance).

The many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, it is not detailed to limit the invention and accordingly, all suitable modifications are equivalents may be resorted to, falling within the scope of the invention.

What we claim is:

1. A method of manufacturing a low hydrogen-concentration silicon crystal containing substantially supersaturated oxygen, comprising the steps of:

measuring a hydrogen concentration in a silicon crystal substantially containing supersaturated oxygen; and discriminating the silicon crystal whether it is equivalent to the low hydrogen concentration silicon crystal or not according to degree of said measured hydrogen concentration.

2. A method of manufacturing a low hydrogen-density silicon crystal as recited in claim 1, wherein the step of measuring the hydrogen concentration further comprises the steps of:

a donor-generating annealing process for generating thermal donors by heating at a condition equally applied to the silicon crystal and a plurality of hydrogen-doped silicon crystals each having a hydrogen concentration, said hydrogen concentration being already known, said known hydrogen concentration being different from each other; next measuring respective concentrations of said thermal donors in the silicon crystal and in said hydrogen-doped silicon crystals; and next acquiring a hydrogen concentration in the silicon crystal by interpolating or extrapolating said thermal donor concentration in said silicon crystal into a relation between said thermal donor concentration and said known hydrogen concentrations of hydrogen-doped silicon crystals.

3. A method of manufacturing a low hydrogen-concentration silicon crystal as recited in claim 1, wherein the step of measuring hydrogen concentration in the silicon crystal further comprises the steps of:

an outward-diffusing process for outwardly diffusing hydrogen in the vicinity of a surface of a hydrogen-doped silicon crystal having a hydrogen concentration $C_s$, by heating the hydrogen-doped silicon crystal in an atmosphere including substantially none of hydrogen content, for a period t, and at a temperature $T_D$; next a donor-generating annealing process for generating thermal donors in the silicon crystal and in the hydrogen-doped silicon crystal by heating at a condition equally applied to the silicon crystal and said hydrogen-doped silicon crystal;

measuring concentration of said thermal donors in the silicon crystal as well as the distribution of thermal donor concentration along a depth direction in the vicinity of a surface of said hydrogen-doped silicon crystal;

acquiring a depth x from said surface of said hydrogen-doped silicon crystal, the thermal donor concentration observed at said depth x being equal to said thermal donor concentration in said silicon crystal; and calculating a hydrogen concentration C in said silicon crystal by the use of a formula employing an error function complement erfc:

$$C = C_s(1 - erfc(x(Dt)^{-1/2}/2))$$

where D is a diffusion constant of hydrogen at a temperature $T_D$ in said silicon crystal.

4. A method of manufacturing a low hydrogen-concentration silicon crystal, comprising the steps of:

a donor-generating annealing process for generating thermal donors in the silicon crystal and in hydrogen-doped silicon crystal by annealing the silicon crystal and the hydrogen-doped silicon crystal having known hydrogen concentration at an equal condition; and discriminating the silicon crystal whether its is equivalent to the low hydrogen-concentration silicon crystal or not by comparing the thermal donor concentration in the silicon crystal with said thermal donor concentration in said hydrogen-doped silicon crystal.

5. A method of manufacturing a low hydrogen-concentration silicon crystal as recited in claim 2, 3 or 4, comprising the step of:

a hydrogen-diffusing process, wherein a silicon crystal is annealed at a temperature in an atmosphere including hydrogen, so as to produce the hydrogen-doped silicon crystal having a hydrogen concentration which thermally equilibrates with a hydrogen partial pressure in said atmosphere at said annealing temperature.

6. A method of manufacturing a low hydrogen-concentration silicon crystal as recited in claim 5, comprising the step of:

producing a plurality of hydrogen-doped silicon crystals each having a different hydrogen concentration, by using a plurality of said hydrogen-diffusing processes where said hydrogen partial pressure in said hydrogen-including atmosphere is set to be different with respect to the hydrogen-diffusing processes but said annealing temperature is set equal throughout the hydrogen-diffusing process.

7. A method of manufacturing a low hydrogen-concentration silicon crystal as recited in claim 5, comprising the step of:

producing a plurality of hydrogen-doped silicon crystals each having a different hydrogen concentration, by using a plurality of hydrogen-diffusing processes where said hydrogen partial pressure in said hydrogen-including atmosphere is set to be equal throughout the hydrogen diffusing processes but said annealing temperature is set to be different with respect to the hydrogen diffusing processes.

8. A method of manufacturing a low hydrogen-concentration silicon crystal as recited in claim 2, 3 or 4, wherein of said donor-generating annealing process is carried out at temperature lower than 430° C.

9. A method of manufacturing a low hydrogen-concentration silicon crystal as recited in claim 8, wherein said donor-generating annealing process is carried out in a period less than 1 hour.

10. A manufacturing method of semiconductor devices using a silicon substrate cut out from an ingot containing substantially supersaturated oxygen, comprising the steps of:

measuring a hydrogen concentration in said silicon crystal cut out from said ingot;

discriminating the ingot whether it is a low hydrogen ingot or not according to the degree of said hydrogen concentration; and producing said substrate from thus discriminated low hydrogen-concentration ingot.

11. A manufacturing method of semiconductor devices as recited in claim 10, wherein said step of measuring hydrogen concentration in the silicon crystal comprises the steps of:

a donor-generating annealing process where said silicon crystal cut out from said ingot and a plurality of hydrogen-doped silicon crystals each having different known hydrogen concentration are annealed at an equal condition so as to generate thermal donors therein;

measuring thermal donor concentrations in said silicon crystal and in said hydrogen-doped silicon crystals;

acquiring a hydrogen concentration in said silicon crystal by interpolating or extrapolating said thermal donor concentration in said silicon crystal onto the relation between said hydrogen concentrations in said hydrogen-doped silicon crystals and said known hydrogen concentration in said silicon crystal.

12. A manufacturing method of semiconductor devices as recited in claim 10, wherein said step for measuring hydrogen density in said silicon crystal comprises the steps of:

an outward-diffusing annealing step in which a hydrogen-doped silicon crystal having a hydrogen concentration Cs is annealed in an atmosphere including substantially none of hydrogen for an annealing period t at a temperature $T_D$ so as to diffuse outwards the hydrogen in the vicinity of surface of the hydrogen-doped silicon crystal;

a donor-generating annealing process in which said silicon crystal cut out from said ingot and said hydrogen-doped silicon crystal are annealed under an equal condition so as to generate thermal donors therein;

measuring the concentration of said thermal donor in said silicon crystal and the distribution of thermal donors along depth direction in the vicinity of a surface of said hydrogen-doped silicon crystal;

obtaining a depth x from the surface of said hydrogen-doped silicon crystal at which said thermal donor concentration equal to said thermal donor concentration in said silicon crystal is observed; and calculating a hydrogen concentration C of said silicon crystal form a formula:

$C=Cs(1-erfc(x(Dt)^{-1/2}/2)$ wherein D is diffusion constant of hydrogen in silicon at a temperature $T_D$, and erfc is an error function complement.

13. A manufacturing method of semiconductor devices using a silicon substrate cut out from an ingot including substantially supersaturated oxygen, comprising the steps of:

a donor-generating annealing process to generate thermal donors by annealing a silicon crystal cut out from the ingot and a hydrogen-doped silicon crystal having known hydrogen concentration at an equal condition;

discriminating a silicon crystal whether it includes low-content thermal donors or not by comparing a donor concentration in said hydrogen-doped silicon crystal and a donor concentration in said silicon crystal; and manufacturing the silicon substrate from said ingot from which said sorted silicon crystal was cut out.

14. A manufacturing method of semiconductor devices as recited in claim 11, 12 or 13, comprising the step of:

hydrogen-diffusing annealing process at which said silicon crystal is annealed in an atmosphere including hydrogen so as to produce said hydrogen-doped silicon crystal having a hydrogen concentration which thermally equilibrates with the hydrogen partial pressure in the atmosphere.

15. A manufacturing method of semiconductor devices as recited in claim 14, comprising the step of:

producing a plurality of hydrogen-doped silicon crystals each having a different hydrogen concentration, by using a plurality of said hydrogen-diffusing processes where said hydrogen partial pressures in said hydrogen-including atmosphere is set to be different with respect to the hydrogen-diffusing processes but said annealing temperature is set equal throughout the hydrogen-diffusing process.

16. A manufacturing method of semiconductor devices as recited in claim 14, comprising the step of:

producing hydrogen-doped silicon crystals each having a different hydrogen concentration, by using a plurality of hydrogen-diffusing processes where said hydrogen partial pressures in said hydrogen-including atmosphere is set to be equal with respect to the hydrogen-diffusing processes but said annealing temperature is set to be different with respect to the hydrogen-diffusing processes.

17. A manufacturing method of semiconductor devices as recited in claim 11, 12 or 13, wherein said donor-generating annealing process is carried out at a temperature lower than 430° C.

18. A manufacturing method of semiconductor devices as recited in claim 17, wherein said donor-generating annealing process is carried out in a period shorter than 1 hour.

19. A method of measuring hydrogen density in a silicon crystal, comprising the steps of:

a donor-generating annealing process for annealing at an equal condition a silicon crystal and a plurality of hydrogen-doped silicon crystals having respective known hydrogen concentrations different from each other so as to generate thermal donors therein;

measuring respective concentration of said thermal donors in said silicon crystal and in said hydrogen-doped silicon crystals;

acquiring a hydrogen concentration in said silicon crystal by interpolating or extrapolating said thermal donor concentration in said silicon crystal into a relation between said thermal donor concentration and said known hydrogen concentration of the hydrogen-doped silicon crystals.

20. A method of measuring hydrogen density in a silicon crystal, comprising the steps of:

an outward-diffusing process for outwardly diffusing hydrogen in the vicinity of a surface of a hydrogen-doped silicon crystal having a hydrogen concentration Cs, by heating the hydrogen-doped silicon crystal in an atmosphere including substantially none of hydrogen content, for a period t, and at a temperature $T_D$;

a donor-generating annealing process for generating thermal donors in the silicon crystal and in the hydrogen-doped silicon crystal by annealing at a condition equally applied to the silicon crystal and said hydrogen-doped silicon crystals;

measuring concentration of said thermal donors in the silicon crystal as well as the distribution of thermal donor density along a depth direction in the vicinity of a surface of said hydrogen-doped silicon crystal;

acquiring a depth x from said surface of said hydrogen-doped silicon crystal, the thermal donor concentration observed at said depth x is equal to said thermal donor concentration in said silicon crystal; and calculating a hydrogen concentration C in said silicon crystal by the use of a formula employing an error function complement erfc:

$$C = Cs(1 - erfc(x(Dt)^{-1/2}/2)$$

where D is a diffusion constant of hydrogen at a temperature $T_D$ in said hydrogen-doped silicon crystal.

* * * * *